(12) United States Patent
Yu

(10) Patent No.: US 9,891,248 B2
(45) Date of Patent: Feb. 13, 2018

(54) ACQUISITION MEMORY ALLOCATION FOR DIGITAL STORAGE OSCILLOSCOPE

(75) Inventor: Haiwen Yu, Shanghai (CN)

(73) Assignee: Tektronix, Inc., Beaverton, OR (US)

(*) Notice: Subject to any disclaimer, the term of this patent is extended or adjusted under 35 U.S.C. 154(b) by 904 days.

(21) Appl. No.: 13/600,093

(22) Filed: Aug. 30, 2012

(65) Prior Publication Data

US 2013/0231882 A1    Sep. 5, 2013

(30) Foreign Application Priority Data

Sep. 28, 2011  (CN) .............................. 201110312584

(51) Int. Cl.
    *G01R 13/02*    (2006.01)

(52) U.S. Cl.
    CPC ....... *G01R 13/0272* (2013.01); *G01R 13/029* (2013.01); *G01R 13/0236* (2013.01)

(58) Field of Classification Search
    CPC .............. G01R 13/225; G01R 13/0236; G01R 13/029; G01R 13/0272
    See application file for complete search history.

(56) References Cited

U.S. PATENT DOCUMENTS

| | | | |
|---|---|---|---|
| 6,459,256 B1 | 10/2002 | Pickerd | |
| 6,748,335 B2 * | 6/2004 | Pickerd | ........................... 702/66 |
| 6,807,496 B2 | 10/2004 | Pickerd | |
| 7,158,137 B2 | 1/2007 | Dobyns et al. | |
| 2011/0066402 A1 | 3/2011 | Dobyns | |

OTHER PUBLICATIONS

Extended European Search Report and Opinion for European Patent Application No. 12186671.9, mailed Jan. 25, 2017, 10 pages.

* cited by examiner

*Primary Examiner* — Bryan Bui
(74) *Attorney, Agent, or Firm* — Marger Johnson; Andrew J. Harrington

(57) ABSTRACT

The present disclosure provides an acquisition system for oscilloscopes having n input channels. The acquisition system comprises n A/D converters ($2._1, 2._2, \ldots, 2._n$) with each of the n A/D converters receiving a signal under test from one of n channels and digitizing the received signal into digital samples; an acquisition memory for storing the digitized samples from the n A/D converters; and a memory allocation processor for dynamically allocating memory lengths (or memory depths) for the selected n input channels within an acquisition memory based on the user setting from the oscilloscope. To efficiently use the acquisition memory, the acquisition system does not allocate any memory areas for the input channels that are not selected. In addition, the acquisition system can set up sampling rates for the n input channels based on the frequencies of the signals under test received from the n input channels.

23 Claims, 8 Drawing Sheets

ACQUISITION MEMORY ALLOCATION FOR DIGITAL STORAGE OSCILLOSCOPE

FIELD OF THE INVENTION

The present disclosure relates generally to signal acquisition instruments and, more specifically, to a signal acquisition display architecture adapted for using with a digital storage oscilloscope having multiple input channels or other signal acquisition and display devices.

BACKGROUND OF THE INVENTION

Usually, a digital storage oscilloscope has multiple input channels with each of the multiple channels capable of receiving an analog signal under test. Each of the multiple input channels has a respective analog-to-digital (A/D) converter to digitize the received analog signal under test into a stream of digital samples (or sample data) at a predetermined sampling rate. As known in the field, a digital storage oscilloscope includes an acquisition memory to store multiple streams of digitized samples to represent the analog signals under test. After accumulating enough digital samples in the acquisition memory, the digital storage oscilloscope re-assembles the received analog signals under test and displays them on its screen.

Even through the existing digital storage oscilloscopes generally meet the needs for certain applications, they have some shortcomings Specifically, in the existing digital storage oscilloscopes, the sampling rates and record lengths are same for all input channels that acquire and/or measure different input signals under test. It is usually impossible, or at least not flexibly, to share an acquisition memory among all input channels that acquire and/or measure different analog signals under test. The existing digital storage oscilloscopes can use two (or four) channels to acquire and/or measure one input signal with each of the two (or four) channels receiving a part of the data samples for the input signal and store the two (or four) parts of the sample data into the two (or four) memory areas that are allocated in the acquisition memory for the two (or four) channels. The existing digital storage oscilloscopes then re-assemble the one input signal based on the two (or four) parts of the sample data stored in the two (or four) memory areas of the acquisition memory. In this manner, the existing digital storage oscilloscopes can use so called "interleaving technology" to double (or quadruple) the sampling rate and record length for one active input channel by turning off the other one (or three) input channels, but "internally combining" the path(s) for the one (or three) inactive channels into the one active input channel. Even though the existing digital storage oscilloscopes can share multiple memory areas (unusually in even number) for one input signal, they are unable to proportionally allocate memory area(s) in an acquisition memory to the selected (or active) channels that acquire and/or measure different input signals under test, but not to allocate any memory areas in the acquisition memory for the non-selected (or inactive) channels. In other words, the existing digital storage oscilloscopes are unable to dynamically allocate memory areas in the acquisition memory for the selected (or active) channels that acquire and/or measure different input signals.

In addition, when its multiple input channels acquire and/or measure both slow and high frequency (or speed) signals, an existing digital storage oscilloscope defines its sampling rate in adapting to the signal with the highest frequency (speed). Therefore, in an existing digital storage oscilloscope, the acquisition memory resource assigned to an input channel that acquires a signal with slower speed may be unnecessarily large while the acquisition memory resource assigned to another input channel that acquires a signal with a faster speed is inadequate to re-assemble their respectively received signals.

Therefore, there is a need to provide improved signal acquisition display architecture in digital storage oscilloscopes that can flexibly share acquisition memory resources among multiple input channels that acquire and/or measure different input signals when one or more of the multiple input channels are not selected (or inactive).

There is another need to provide improved signal acquisition display architecture in digital storage oscilloscopes that can efficiently allocate acquisition memory resources among multiple input channels when the multiple input channels acquire and/or measure signals under test that have different frequencies (or speeds).

SUMMARY

To overcome the shortcomings in the existing digital storage oscilloscope, the present invention provides improved acquisition systems.

In a first aspect, the present disclosure provides an acquisition system for an oscilloscope, which comprises:
  a. a plurality of channels that acquire and/or measure different input signals;
  b. a plurality of A/D converters ($2._1$, $2._2$, ..., $2._n$) with each of the plurality of A/D converters receiving a signal under test from one of the plurality of channels and digitizing the received signal into digital samples;
  c. an acquisition memory (10), which is coupled to the plurality of A/D converters, for storing the digitized samples from the plurality of A/D converters; and
  d. a memory allocation processor (4) for allocating one or more memory lengths (or a memory depths) within the acquisition memory for at least selected one of the plurality of channels.

Corresponding to the acquisition system in the first aspect, the present disclosure provides a method for allocating memory resource, which comprises the steps of:
  a. selecting one or more channels from the plurality of channels that acquire and/or measure different input signals; and
  b. allocating memory resource in the acquisition memory (10) by partitioning the acquisition memory (10) into one or more memory lengths in response to the selection of the plurality of channels.

In a second aspect, the present disclosure provides an acquisition system for an oscilloscope having a plurality of channels, which comprises:
  a. a plurality of A/D converters ($2._1$, $2._2$, ..., $2._n$) with each of the plurality of A/D converters receiving a signal under test from one of the plurality of channels and digitizing the received signal into digital samples;
  b. a sampling rate controller (7) for controlling the sampling rates for the plurality of A/D converters based on the speeds (or frequencies) of the signals from the plurality of channels; and
  c. an acquisition memory (10) for storing the digitized samples from the plurality of A/D converters.

Corresponding to the acquisition system in the second aspect, the present disclosure provides a method for allocating memory resource, which comprises the steps of:
  a. designating sample rate or sampling rates for the plurality of channels;

b. converting the input signals into digitized sample data using the designated sampling rate or sampling rates; and c. allocating memory resource in the acquisition memory (10) by partitioning the acquisition memory (10) into a plurality of memory lengths in response to the designated sampling rates.

Corresponding to the acquisition system in the second aspect, the present disclosure provides another method for allocating memory resource, which comprises the steps of:

a. detecting frequencies for the signals that are acquired from a plurality of channels;

b. designating sampling rates for the plurality of channels in response to the detected frequencies;

c. converting the input signals into digitized sample data using the designated sampling rate or sampling rates; and d. allocating memory resource in the acquisition memory (10) by partitioning the acquisition memory (10) into a plurality of memory lengths in response to the designated sampling rates.

By providing the structures in the above mentioned improved acquisition system and the steps in the above mentioned methods for allocating memory resource, the present disclosure overcomes the above mentioned shortcomings in the existing digital storage oscilloscopes.

DESCRIPTION OF THE DRAWINGS

The present invention will be described with reference to the accompanying drawings, wherein.

DETAILED DESCRIPTION OF THE EMBODIMENTS

Reference is now made to the embodiments, examples of which are illustrated in the accompanying drawings.

Figure 1:
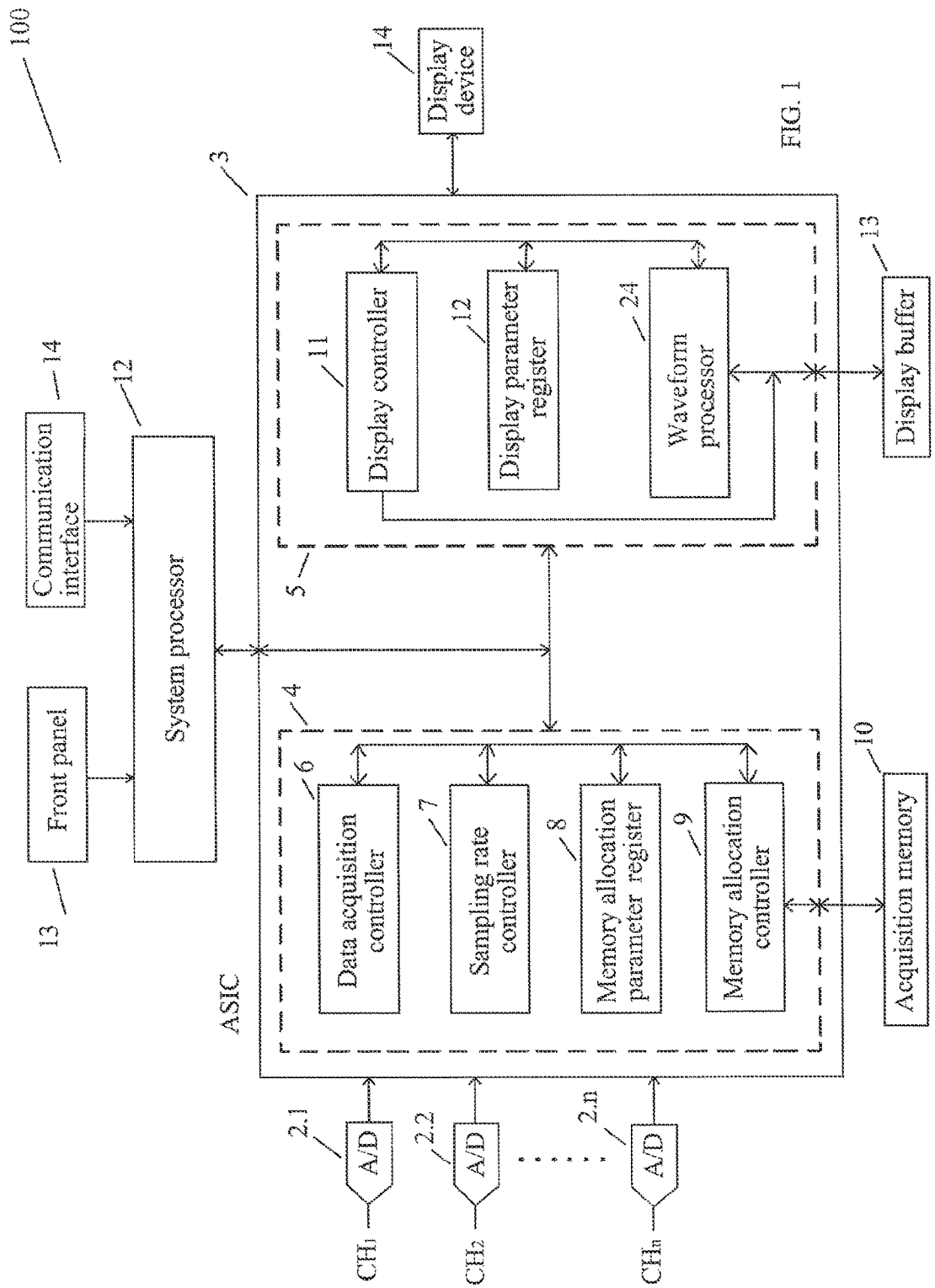
FIG. 1 shows an illustrative block diagram of a multiple channel digital storage oscilloscope 100 according to the present disclosure.

FIG. 1 shows an illustrative block diagram of a multiple channel digital storage oscilloscope 100 according to the present disclosure. As shown in FIG. 1, the digital storage oscilloscope 100 includes n channels (CH.$_1$, CH.$_2$, . . . , CH.$_n$), n analog-to-digital (A/D) converters 2 (2.$_1$, 2.$_2$, . . . , or 2.$_n$), a sampling date processor 3 (an Application Specific Integrated Circuit—ASIC), a system processor 12, an acquisition memory 10, a display buffer 13 and a display device 14. Each of the n channels CH.$_i$ is coupled to a corresponding convertor 2.$_i$ for receiving an analog signal under test via a probe and cable arrangement (not shown) and digitizing the received analog signal into a stream of digital samples (or sample data) at predetermined time intervals. Each of the digital samples associates with a numerical value. The digitized samples from the n A/D converters 2 (2.$_1$, 2.$_2$, . . . , or 2.$_n$) are then applied to the sampling date processor 3, where the digital samples (or sample data) are processed and re-assembled to ultimately display signals under test on the display device 14. To control the overall activities (or operation) of the digital storage oscilloscope 100, the system processor 12 is coupled to the sampling date processor 3, which is further coupled to the acquisition memory 10, display buffer 13 and display device 14.

To enable a user to externally input memory allocation and/or data display parameters into the digital storage oscilloscope 100, a front panel 13 and a communication interface 14 (such as USB, UART, LAN or GPIB ports) are coupled to the system processor 12. The communication interface 14 allows a user to remotely control the digital storage oscilloscope 100 or to build an automated test system from a control device. A user can externally input display parameters (including selected channel numbers, designated sampling rates and designated memory lengths) by manipulating the knobs or buttons (shown in FIG. 7) on the front panel 13 or operating communicating with the communication interface 14 through a control device, such as a personal computer (not shown). Upon receiving the requests/commands from the front panel 13 or communication interface 14, the system processor 12 converts them into the signals that can be recognized by the sampling date processor 3 and send them to the sampling date processor 3.

As shown in FIG. 1, the sampling date processor 3 includes a memory allocation processor 4 for processing the sample data from the n A/D converters 2 (2.$_1$, 2.$_2$, . . . , or 2.$_n$) and storing the processed sample data into the acquisition memory 10. The sampling date processor 3 also includes a display processor 5, which is coupled to the memory allocation processor 4, for further processing the sample data stored in the acquisition memory 10 into displayable formats, storing the further processed sample data into the display buffer 13 to free the acquisition memory 10 for a subsequent group of sample data, and displaying the sample data on the display device 14 in a wave format.

More specifically, the memory allocation processor 4 includes a data acquisition controller 6, a sampling rate controller 7, a memory allocation parameter register 8 and a memory allocation controller 9. To control the overall activities (or operation) of the memory allocation processor 4, the data acquisition controller 6 is coupled to the sampling rate controller 7, memory allocation parameter register 8 and memory allocation controller 9. The sampling rate controller 7, memory allocation parameter register 8 and memory allocation controller 9 can communicate with each other under the control of the data acquisition controller 6.

Within the memory allocation processor 4, the sampling rate controller 7 can set up the sampling rates and control the sampling rates for the selected ones of the n A/D converters 2 ($2_{.1}$, $2_{.2}$, ..., or $2_{.n}$) in response to the inputs from the front panel 13/communication interface 14 or from the signals received from the n channels ($CH_{.1}$, $CH_{.2}$, ..., $CH_{.n}$). The memory allocation parameter register 8 can receive and store memory allocation parameters (including selected channel numbers, designated sampling rates and designated memory lengths) that are received from the data acquisition controller 6 or the system processor 12. The memory allocation controller 9 can allocate memory lengths (or record lengths) for the selected ones of the n channels ($CH_{.1}$, $CH_{.2}$, ..., $CH_{.n}$) in response to the memory allocation parameters in the memory allocation parameter register 8 and store the sample data into the allocated memory areas in the acquisition memory 10.

The display processor 5 includes a display controller 11, a display parameter register 12 and a waveform processor 24. The display parameter register 12 is coupled to the display controller 11 and waveform processor 24. Within the display processor 5, the display parameter register 12 stores the display parameters including the selected channel numbers, memory lengths and other parameters (such as vertical offset and scale, horizontal offset and scale etc). Both of the display controller 11 and waveform processor 24 are coupled to the display buffer 13. The waveform processor 24 receives sample data from the memory allocation processor 4, processes them into desirable wave format suitable to display according to the display parameters in the display parameter register 12 and stores the wave-format sample data into the display buffer 13. The display controller 11 reads the wave-format sample data from the display buffer 13 and displays them on the display device 14 in a wave format according to the display parameters in the display parameter register 12.

Figure 2A:
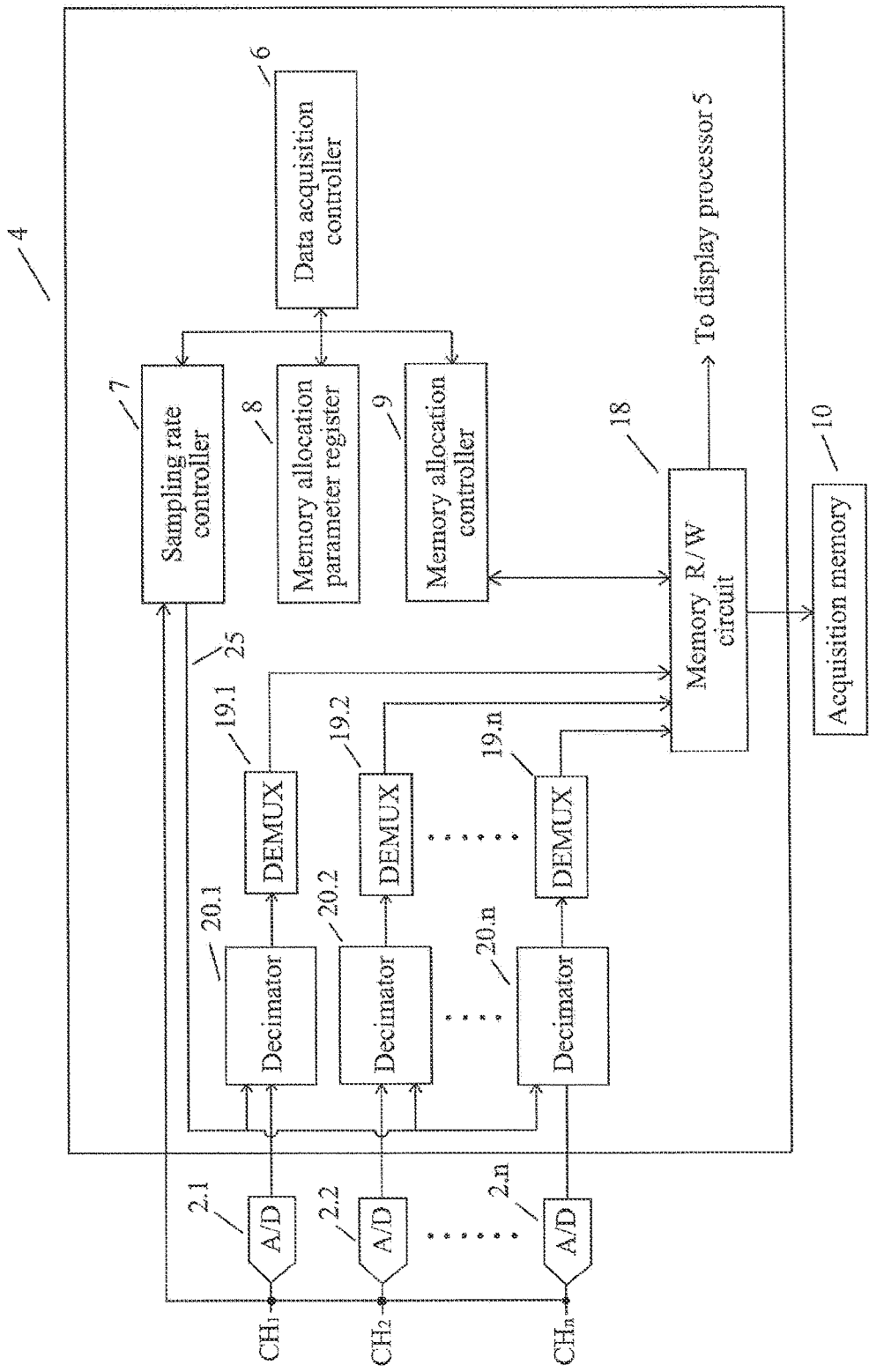
FIG. 2A shows the memory allocation processor 4 of FIG. 1 in greater details according to one embodiment of the present disclosure.

FIG. 2A shows the memory allocation processor 4 in greater details according to one embodiment of the present disclosure. As shown in FIG. 2A, the memory allocation processor 4 further includes a memory R/W (Read/Write) circuit 18, n DEMUX (demultiplexer unit) 19 ($19_{.1}$, $19_{.2}$, ..., $19_{.n}$) and n decimator logics 20 ($20_{.1}$, $20_{.2}$, ..., $20_{.n}$).

Each of the n DEMUX $19_{.i}$ (i=1, 2, ..., n) is coupled to a corresponding one of the n decimator logics $20_{.i}$ (i=1, 2, ..., n) and controls the flow of the sample data into the acquisition memory 10 for a corresponding one of the n channels $CH_{.i}$ (i=1, 2, ..., n) in response to a trigger signal T for the n channels. In absence of the trigger signal T, the DEMUX $19_{.i}$ (i=1, 2, ..., n) continuously writes sample data into the acquisition memory 10. When the trigger signal T is received, the DEMUX $19_{.i}$ (i=1, 2, ..., n) continues to write sample data into the acquisition memory 10 for only as long as necessary to store the required amount of poster trigger data. At that time, the DEMUX $19_{.i}$ (i=1, 2, ..., n) stops writing sample data into the acquisition memory 10 until a signal is received indicating that the acquisition memory 10 has been unloaded into the display processor 5.

Each of the n decimator logics $20_{.i}$ (i=1, 2, ..., n) has two inputs and one output with one of the two inputs being coupled to the output of a corresponding one of the n A/D convertors $2_{.i}$ (i=1, 2, ..., n) and the other one of the two inputs being coupled to the output of the sampling rate controller 7. The output in each of the n decimator logics $20_{.i}$ (i=1, 2, ..., n) is coupled to the input in a respective one of the n DEMUX $19_{.i}$ (i=1, 2, ..., n). To store sample data into the acquisition memory 10 based on the memory allocation parameters, the memory R/W (Read/Write) circuit 18 is coupled to the memory allocation controller 9, acquisition memory 10 and outputs of the n DEMUX $19_{.i}$ (i=1, 2, ..., n).

The sampling rate controller 7 can control the sampling rates of the n decimator logics 20 ($20_{.1}$, $20_{.2}$, ..., $20_{.n}$) in response to the information in the memory allocation parameter register 8. To automatically set up sampling rates for the n channels ($CH_{.1}$, $CH_{.2}$, ..., $CH_{.n}$), the sampling rate controller 7 is coupled to the n channels ($CH_{.1}$, $CH_{.2}$, ..., $CH_{.n}$) so that it can detect the frequencies (or speeds) of the signals under test that are acquired and/or measured by the n channels.

In the memory allocation processor 4 as shown in FIG. 2A, the n A/D converters 2 ($2_{.1}$, $2_{.2}$, ..., or $2_{.n}$) are all run at the highest sampling rate (or sampling speed) to generate the sample data for the n channels ($CH_{.1}$, $CH_{.2}$, ..., $CH_{.n}$). To form different sampling rates for different ones of the n A/D converters 2 ($2_{.1}$, $2_{.2}$, ..., or $2_{.n}$), each of the n decimator logics $20_{.i}$ (i=1, 2, ..., n) selectively discards the digital samples from the corresponding one of the n A/D converter $2_{.i}$ (i=1, 2, ..., n) under control of the sampling rate controller 7. In general, to run one of the n A/D converter $2_{.i}$ (i=1, 2, ..., n) at 1/k of the highest sampling rate, the respective decimator logic $20_{.i}$ (i=1, 2, ..., n) passes out only one digital sample, but discards k−1 digital sample(s), among/between consecutive k digital samples from the corresponding A/D converter $2_{.i}$ (i=1, 2, ..., n) during a predetermined time interval. By way of one example, to run an A/D converter $2_{.i}$ (i=1, 2, ..., n) at 1/6 (k=6) of the highest sampling rate, the sampling rate controller 7 sends a control signal to the respective decimator logic $20_{.i}$ (i=1, 2, ..., n) based on the information in the memory allocation parameter register 8 so that the decimator logic $20_{.i}$ passes out only one digital sample, but discards 5 digital samples, among/between consecutive 6 digital samples from the A/D converter $2_{.i}$ (i=1, 2, ..., n) during a predetermined time interval.

It should be appreciated, to a person skilled in the field, the n decimator logics 20 ($20_{.1}$, $20_{.2}$, ..., $20_{.n}$) can be incorporated into the n DEMUX (demultiplexer unit) 19 ($19_{.1}$, $19_{.2}$, ..., $19_{.n}$), respectively. However, such incorporation should be deemed within the spirit of the present disclosure.

To select a portion or all of the n channels ($CH_{.1}$, $CH_{.2}$, ..., $CH_{.n}$) and designate corresponding memory length(s) and/or sampling rate(s) for the selected channel(s), a user can manipulate the knobs or buttons on the front panel 13 (shown in FIG. 7) or operate the communication interface 14 through a control device such as a PC. The system processor 12 converts the selection requests) and/or designation requests) into memory allocation parameters (including selected channel numbers, memory lengths and/or sampling rates) and send them to the data acquisition controller 6. Upon receiving the memory allocation parameters, the data acquisition controller 6 stores them into the memory allocation parameter register 8.

Alternatively, the parameters for sampling rates can be automatically set up by the sampling rate controller 7, instead of being set up by a user. Specifically, the sampling rate controller 7 can detect the frequencies (or speeds) of the signals under test from the n channels ($CH_{.1}$, $CH_{.2}$, ..., $CH_{.n}$) during a predetermined time interval. After knowing the frequency (or speed) of the signal from a particular channel $CH_{.i}$ (i=1, 2, ..., n), the sampling rate controller 7 calculates a sampling rate suitable for the channel $CH_{.i}$ (i=1, 2, ..., n) and stores the sampling rate for the channel into the memory allocation parameter registers 8.

In operation of the digital storage oscilloscope 100 shown in FIG. 2A, after all necessary memory allocation parameters have been stored into the memory allocation parameter register 8, the n A/D converters 2 ($2_{-1}$, $2_{-2}$, . . . , or $2_{-n}$) apply the digitized sample data at the highest sampling rate to the n decimator logics 20 ($20_{-1}$, $20_{-2}$, . . . , $20_{-n}$), respectively. Under the control of the sampling rate controller 7 based on the information in the memory allocation parameter register 8, the n decimator logics 20 ($20_{-1}$, $20_{-2}$, . . . , $20_{-n}$) selectively elects desirable numbers of the sample data to the n DEMUX 19 ($19_{-1}$, $19_{-2}$, . . . , $19_{-n}$) and discards the remaining sample data during a predetermined time interval. For any non-selected channels, the corresponding ones of the n decimator logics 20 ($20_{-1}$, $20_{-2}$, . . . , $20_{-n}$) discard all sample data received. The n DEMUX 19 ($19_{-1}$, $19_{-2}$, . . . , $19_{-n}$) then send the elected sample data to the memory R/W circuit 18. Under the control of the memory allocation controller 9 based on the information in the memory allocation parameter register 8, the memory R/W circuit 18 stores the elected sample data for the selected ones of the n channels ($CH_{-1}$, $CH_{-2}$, . . . , $CH_{-n}$) with the designated memory lengths into the acquisition memory 10. However, the memory R/W circuit 18 will not store any sample data for the channels that are not selected.

Figure 2B:
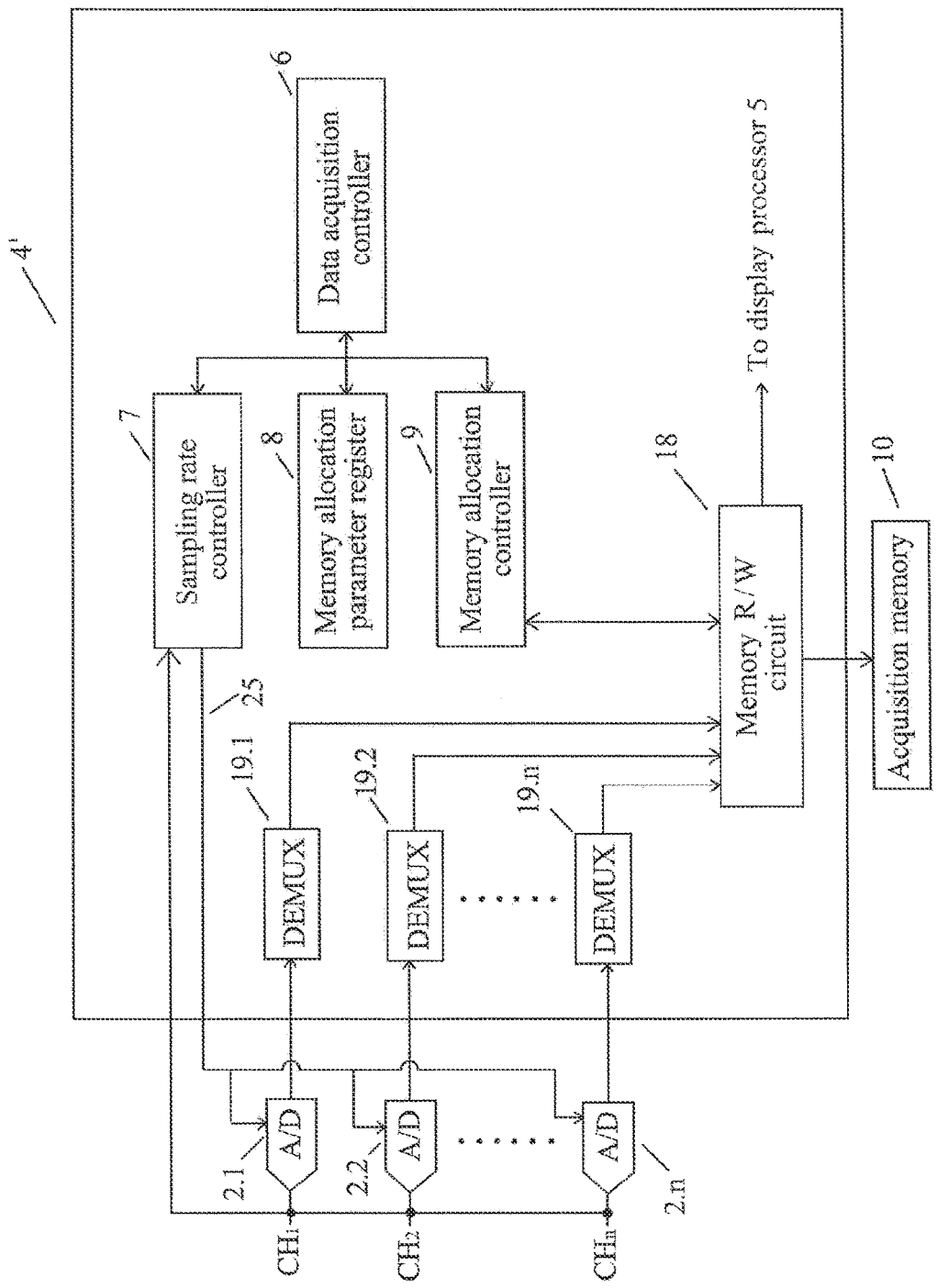
FIG. 2B shows the memory allocation processor 4 of FIG. 1 in greater details according to another embodiment of the present disclosure.

FIG. 2B shows the memory allocation processor 4' in greater details according to another embodiment of the present disclosure.

As shown in FIG. 2B, the memory allocation processor 4' has similar structures as the memory allocation processor 4 shown in FIG. 2A, but the n decimator logics 20 ($20_{-1}$, $20_{-2}$, . . . , $20_{-n}$) shown in FIG. 2A are omitted and the control line 25 of the sampling rate controller 7 is coupled to the n A/D converters 2 ($2_{-1}$, $2_{-2}$, . . . , or $2_{-n}$) so that the sampling controller 7 can directly control the pulses that are generated to sample the n A/D converters 2 ($2_{-1}$, $2_{-2}$, . . . , or $2_{-n}$) according to the sampling rate parameters in the memory allocation parameter register 8.

Figure 2C:
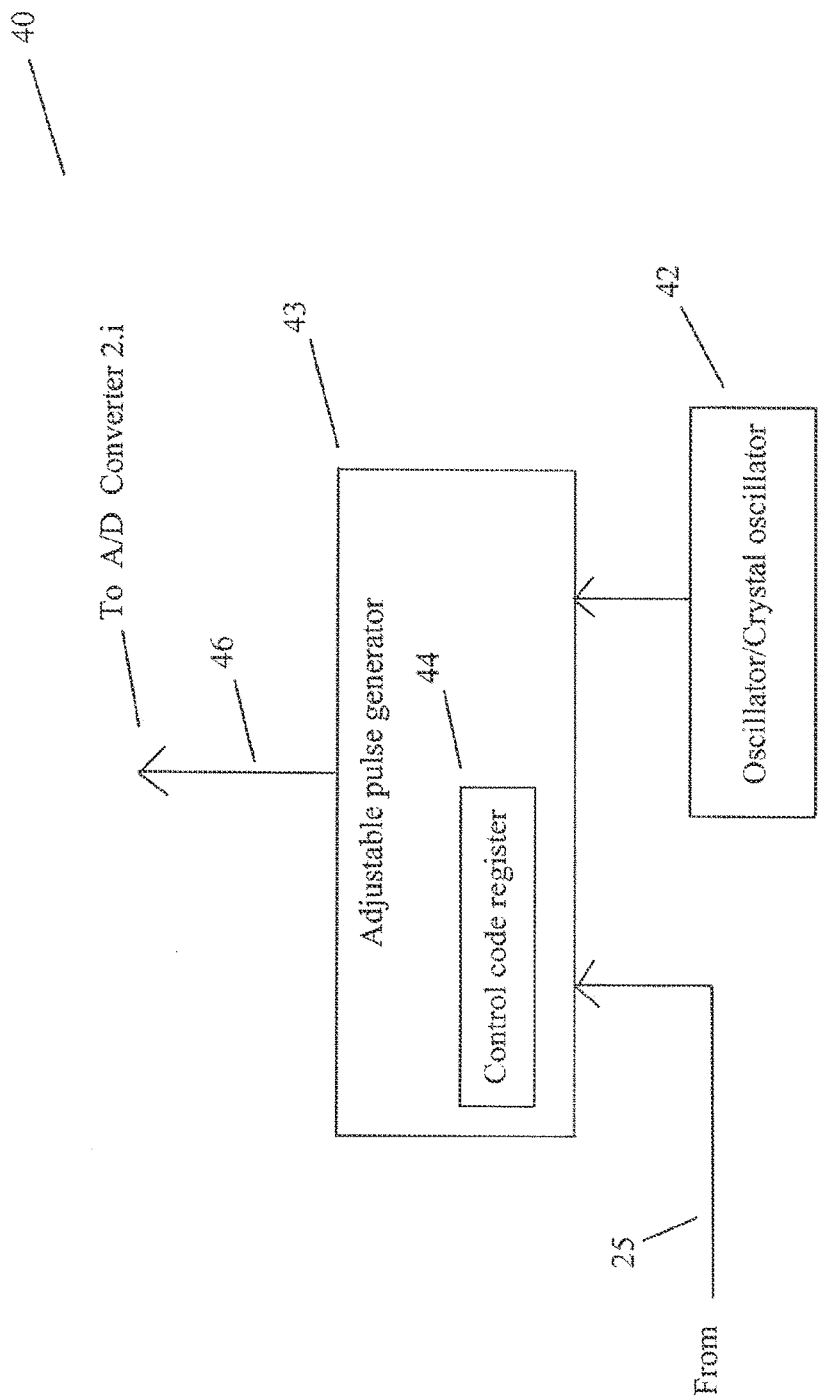
FIG. 2C shows the block diagram of the adjustable pulse generator in each of the n A/D converter 2.$i$ ($i$=1, 2, . . . , n) shown in FIG. 1.

FIG. 2C shows the block diagram showing the sampling pulse generator $40_{-i}$ (i=1, 2, . . . , n) in each of the n A/D converter $2_{-i}$ (i=1, 2, . . . , n) shown in FIG. 2B. As shown in FIG. 2C, the sampling pulse generator 40 includes an oscillator (or a crystal oscillator) 42 for generating a stream of original pulses at a constant frequency and applying the stream of original pulses to an adjustable pulse generator 43. The adjustable pulse generator 43, which includes a control code register 44 for buffering/storing the sampling rate control codes (i.e. the sampling rate parameters) from the output 25 of the sampling rate controller 7, performs wave shaping to the original pulses and generates sampling pulses at the rate according the control codes in the control code register 44. The control code register 44 receives the sampling rate control codes from the sampling rate controller 7. The sampling pulse generator $40_{-i}$ (i=1, 2, . . . , n) sends out the sampling pulses through its output 46 to the corresponding A/D convertor $2_{-i}$ (i=1, 2, . . . , n).

FIGS. 3-6 illustrate different memory allocation schemes in the acquisition memory 10 according to the embodiments of the present disclosure. To facilitate the description of the memory allocation schemes in FIGS. 3-6, it is illustratively assumed that the digital storage oscilloscope 100 has four channels (n=4). In FIGS. 3-6, the dot lines indicate memory allocation boundaries (or memory boundary allocation addresses) in the acquisition memory 10.

Figure 3:
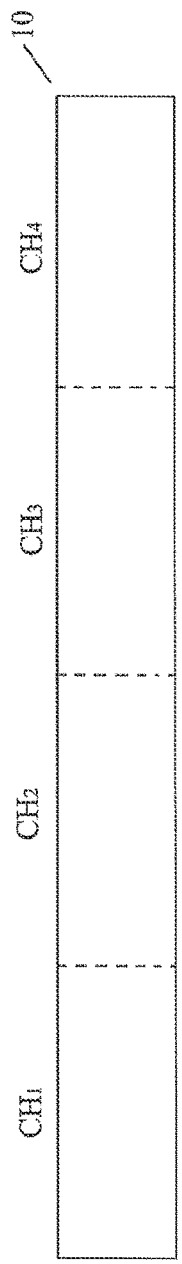
FIGS. 3-6 illustrate different memory allocation schemes in the acquisition memory 10 according to the embodiments of the present disclosure.

FIG. 3 illustrates a memory allocation scheme in which all four channels ($CH_{-1}$, $CH_{-2}$, $CH_{-3}$ and $CH_{-4}$) are selected and the acquisition memory 10 is equally divided/partitioned into four memory areas (or four memory lengths) for the four signals that are received/acquired from the four selected channels.

Figure 4:
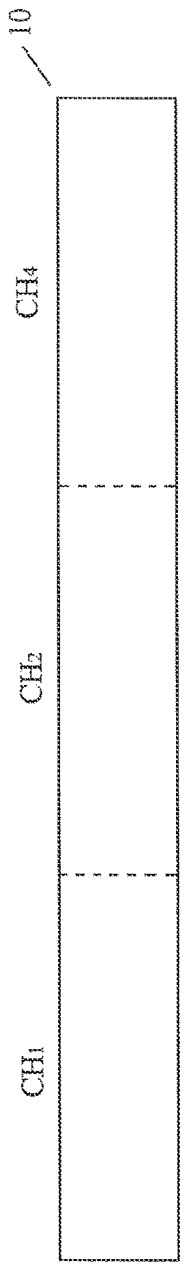

FIG. 4 illustrates a memory allocation scheme in which three of the four channels ($CH_{-1}$, $CH_{-2}$ and $CH_{-4}$) are selected and the acquisition memory 10 is equally divided/partitioned into three memory areas (or three memory lengths) for the three signals that are received/acquired from the three selected channels. As shown, in FIG. 4, the data acquisition controller 6 does not allocate any memory area for the channel $CH_{-3}$ because this channel is not selected (or is inactive).

Figure 5:
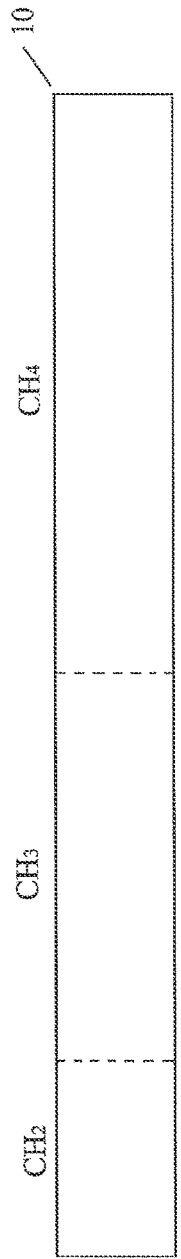

FIG. 5 illustrates a memory allocation scheme in which three of the four channels ($CH_{-2}$, $CH_{-3}$ and $CH_{-4}$) are selected and the acquisition memory 10 is divided/partitioned into three memory areas, proportionally to the frequencies (or speeds) of the three received signals, for the three signals that are received/acquired from the selected three channels. In the memory allocation scheme shown in FIG. 5, it is assumed that the frequency (or speed) of the signal from the channel $CH_{-3}$ is two times faster than that of the signal from the channel $CH_{-2}$; and the frequency (or speed) of the signal from the channel $CH_{-4}$ is three times faster than that of the signal from the channel $CH_{-2}$. Therefore, the memory area (or memory length) allocated for the channel $CH_{-3}$ is two times larger than that for the channel $CH_{-2}$; and the memory area (or memory length) allocated for the channel $CH_{-4}$ is three times larger than that for the channel $CH_{-2}$. As shown in FIG. 5, the data acquisition controller 6 does not allocate any memory area for the channel $CH_{-1}$ because this channel is not selected (or is inactive).

Figure 6:
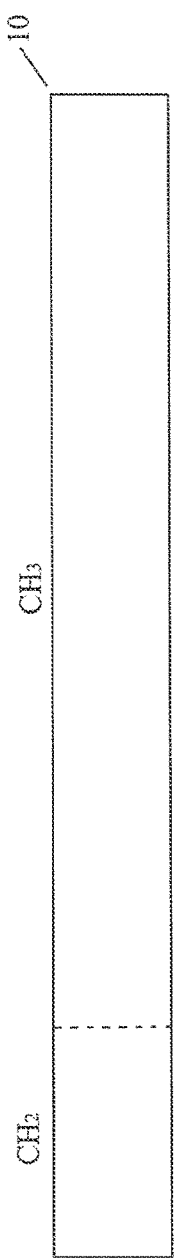

FIG. 6 illustrates a memory allocation scheme in which two of the four channels ($CH_{-2}$ and $CH_{-3}$) are selected and the acquisition memory 10 is divided/partitioned into two memory areas, proportionally to the frequencies (or speeds) of the two received signals, for the two signals that are received/acquired from the selected two channels. In the memory allocation scheme shown in FIG. 6, it is assumed that the frequency (or speed) of the signal from the channel $CH_{-3}$ is five times faster than that of the signal from the channel $CH_{-2}$. Therefore, the memory area (or the memory length) allocated for the channel $CH_{-3}$ is five times larger than that for the channel $CH_{-2}$. As shown, in FIG. 6, the data acquisition controller 6 does not allocate any memory area for the channels $CH_{-1}$ and $CH_{-4}$ because these two channels are not selected (or are inactive).

As shown in FIGS. 3-6, the embodiments in the present disclosure can flexibly allocate acquisition memory resource in response to any selection permutation of the n channels that acquire and/or measure different input signals. In the present disclosure, if only one of the n channels is selected, the data acquisition controller 6 allocates all memory area in the acquisition memory 10 to the selected one channel.

Figure 7:
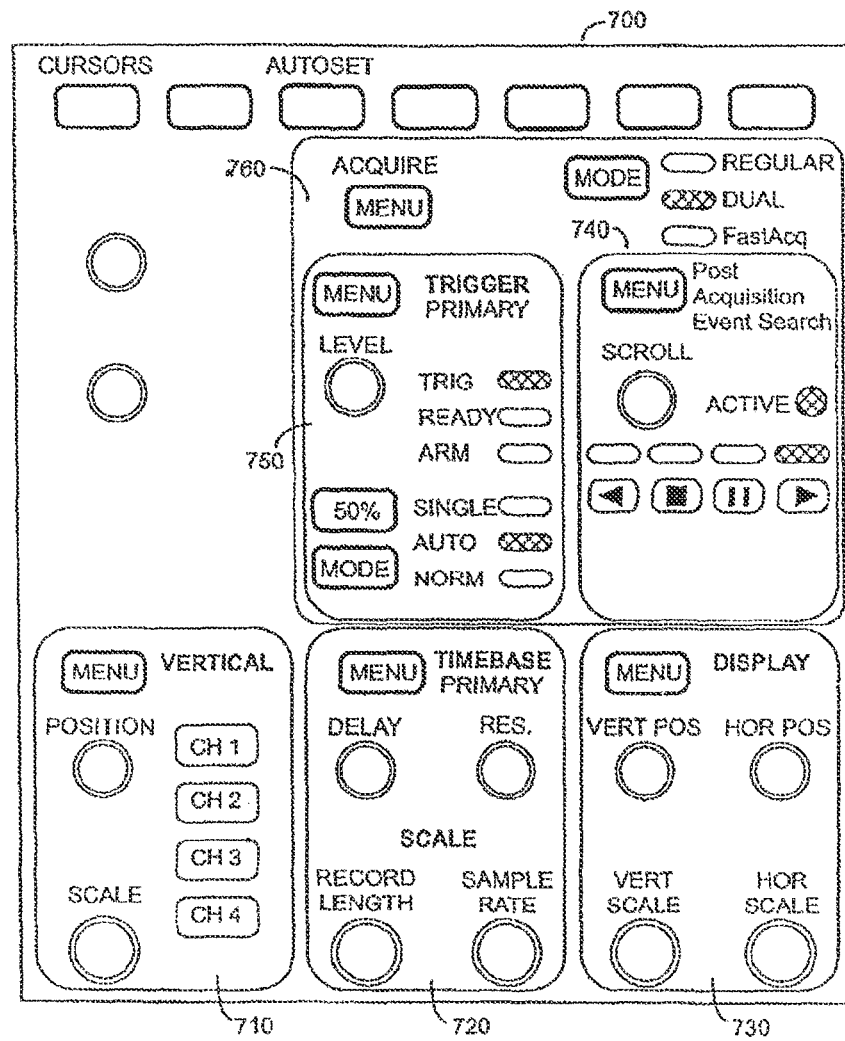
FIG. 7 shows a front panel 700 for the multiple channel digital storage oscilloscope 100 having controls suitable for use with the present disclosure.

FIG. 7 shows a front panel 700 for the multiple channel digital storage oscilloscope 100 having controls suitable for use with the present disclosure. To facilitate the description of the front panel 700 in FIG. 7, it is illustratively assumed that the digital storage oscilloscope 100 has four channels (n=4).

More specifically, the oscilloscope controls on the front panel 700 are arranged in functional groups 710, 720, 730, 740, and 750. Functional groups 740 and 750 are arranged together in a further functional group 760. Front panel 700 includes standard control buttons such as CURSORS and AUTOSET and other control knobs that will not be described in detail. Functional group 710 includes controls for menu selection, for selecting a channel, and for adjusting the scale and position of the displayed signal waveform. Functional group 720 controls the timebase (or interval) aspects (or intervals) of the signal to be acquired, such as Delay, Resolution, Record Length, and Sampling Rate. Functional group 730 controls the Display and includes controls for Horizontal Position, Vertical Position, Vertical Scale and Horizontal Scale.

Functional group 760 includes Functional groups 740 and 750, and also a set of controls for controlling how the oscilloscope is to acquire the waveform samples of the signal under test. Specifically, a button is provided for displaying an Acquire menu on the display screen of the oscilloscope. A second button, labeled MODE, selects among REGULAR MODE, DUAL MODE, and FastAcq MODE. An indicator located next to each of these legends illuminates to show which mode is selected. The Illuminated indicator is depicted in FIG. 7 by a crosshatched pattern. When an operator wants to acquire a long length data record for Post Acquisition Search for Secondary Trigger Events, he/she selects DUAL MODE. In this mode the primary data acquisition record length is set to maximum, and the Post Acquisition Record length (Frame size) is set by the Record Length control of Functional group 720. Functional group 740 controls the Post Acquisition Event Search and includes a MENU button for displaying a menu including a list of trigger event criteria. Note that "replay" of the long length data record is controlled by pushbutton controls that are similar in form and function to the controls of a VCR. In functional group 740, indicators are illuminated to show that a Post Acquisition Event Search is active, and that the long length data record is being played in a forward direction. Functional group 740 also includes a SCROLL knob for manually scrolling through a paused long record length waveform from one event to the next. Functional group 750 contains standard triggering controls and indicators.

In response to manipulation of any knobs or button on the front panel 700, the activation circuit (not shown) generates a request/command that is applied to the system processor 12. Upon receiving the request/command, the system processor 12 coverts it to signal that can be recognized by the sampling data processor 3.

Figure 8:
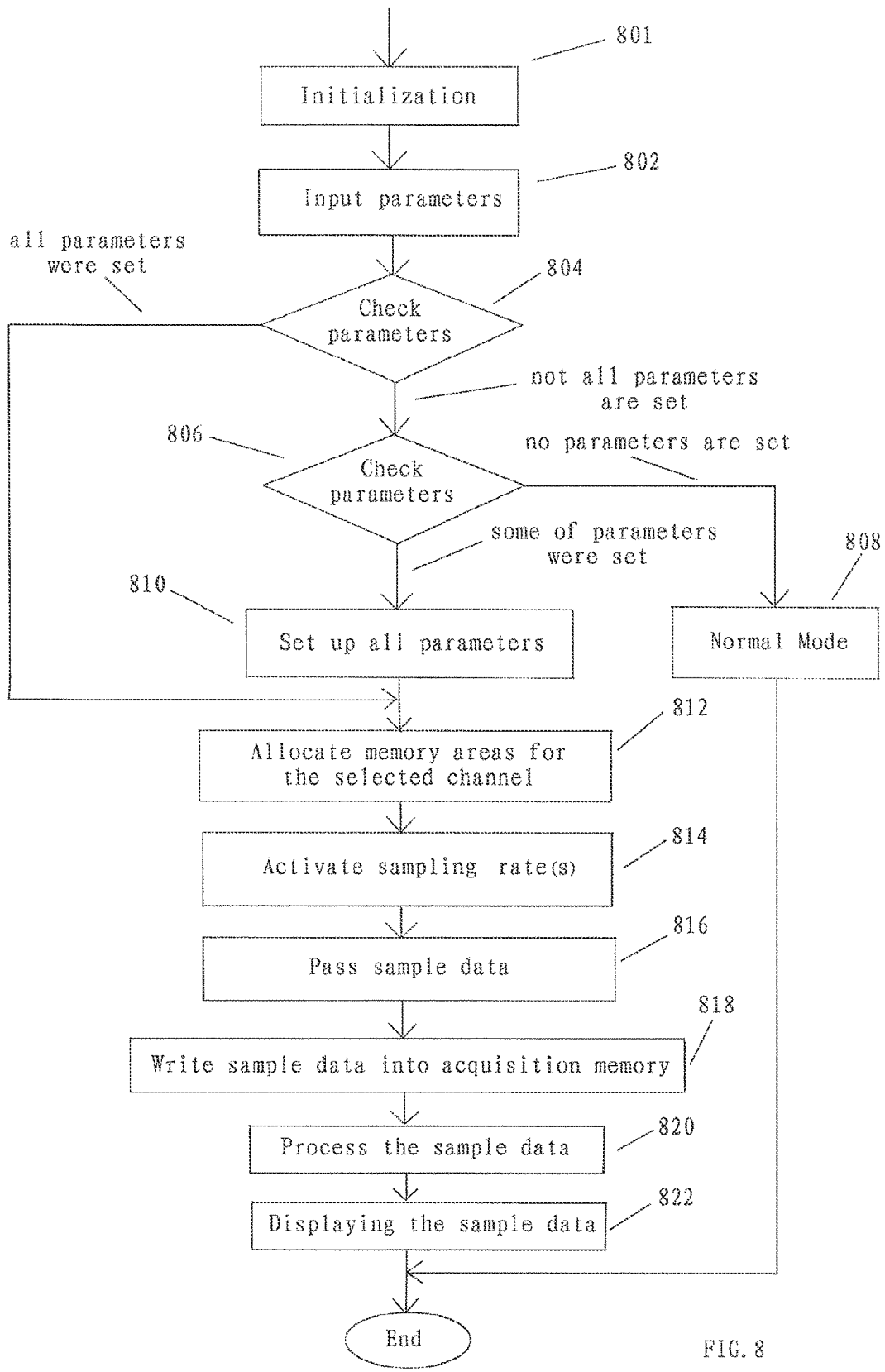
FIG. 8 shows an exemplary flowchart for setting up memory allocation parameters, including selected channel numbers, sampling rates, allocating memory areas (i.e., memory lengths or record lengths), and storing the sample data into the allocated memory areas in the acquisition memory 10.

FIG. 8 shows an exemplary flowchart for setting up memory allocation parameters, including selected channel numbers, sampling rates, allocating memory areas (i.e., memory lengths or record lengths), and storing the sample data into the allocated memory areas in the acquisition memory 10 based on the information in the memory allocation parameter register 8 that are received from the front panel 13, communication interface 14 or sampling rate controller 7.

In step 801, the system processor 12 sets the multiple channel digital storage oscilloscope 100 in initial state, including the memory allocation parameter register 8.

In step 802, the digital storage oscilloscope 100 allows a user to input memory allocation parameters. To select channels, a user may selectively press the four channel buttons CH1, CH2, CH3 and CH4 in the group 710; to designate the memory length (or record length) for a selected channel, the user operates Recode Length knob in the group 720; and to designate sampling rates for a selected channel, the user operates the Sample Rate knob in the group 720. Alternatively, the user can use standard commands to send these parameters to the digital storage oscillator 100 via the communication interface 14. The standard commands are provided to users in the programmer manual for the digital storage oscillator 100. Upon receiving the signals activated by manipulating the buttons and knobs or operating the communication interface 14, the system processor 12 converts these signals into memory allocation parameters and send them to the data acquisition controller 6 (in the sampling date processor 3), which in turn stores them into the memory allocation parameter register 8.

In step 804, the data acquisition controller 6 checks the memory allocation parameter register 8 to determine whether the user has set up all memory allocation parameters. The step 804 can result two possibilities.

In step 804, if the user has set up all memory allocation parameters (including selected channel numbers, memory lengths, and sampling rates), the operation is directly led to step 812.

In step 804, if the user has not set up all memory allocation parameters, the operation is led to step 806, in which the data acquisition controller 6 further checks the memory allocation parameter register 8 to determine whether the user has set up a portion of the memory allocation parameters or has not validly set up any memory allocation parameters at all. The step 806 can also result two possibilities.

In step 806, if the user has not manipulated any of the channel buttons in the group 710 or operated the communication interface 14, the operation is led to step 808, in which the digital storage oscilloscope 100 operates in a normal mode by using same sampling rates and same memory lengths (or record lengths) to allocate memory lengths (or record lengths) in the acquisition memory 10 for all n channels.

In step 806, if the user has manipulated some or all of the channel buttons in the group 710 or operated the communication interface 14, but has not designated any sampling rates and/or memory lengths (or record lengths), the operation is led to step 810, in which the sampling rate controller 7 detects the frequencies (or speeds) of the signals received from the selected channels and sends the detected frequencies to the data acquisition controller 6. Based on the detected frequencies of the signals, the data acquisition controller 6 determines/calculates suitable sampling rates and the memory lengths for the selected channels and stores the determined sampling rates and memory lengths into the memory allocation parameter register 8. Because determining a suitable sampling rate for a signal with a particular frequency (or speed) is know to a person in the filed, the specifics of determining/calculating suitable sampling rates will not be described in details herein. The operation is then led to step 812.

In step 812, the data acquisition controller 6 proportionally allocates memory resource by partitioning acquisition memory 10 into memory areas (or memory lengths) for the selected channels according to the information in the memory allocation parameter register 8. The data acquisition controller 6 also calculates the memory boundaries (or memory boundary addresses) in the acquisition memory 10 (as shown in FIGS. 3-6) based on the memory size of the acquisition memory 10 and memory shares M., (see the step 910 in FIG. 9) and stores these memory boundaries into the memory allocation parameter register 8. Therefore, the memory allocation controller 9 can write the sample data into and read them out from the acquisition memory 10 according to the memory allocation boundaries (or memory allocation boundary addresses) in the memory allocation parameter register 8.

In the step 814, the sampling rate controller 7 shown in FIG. 2A applies control signals to the selected ones of the n DEMUX 19 ($19._1, 19._2, \ldots, 19._n$) based on the information in the memory allocation parameter register 8 so that the selected ones of the n DEMUX 19 (19.$_1$, 19.$_2$, ..., 19.$_n$) elect and discard the sample date from the corresponding ones of the n A/D converters 2 (2.$_1$, 2.$_2$, ..., or 2.$_n$) during a predetermined time interval according to the designated sampling rates. Or the sampling rate controller 7 shown in FIG. 2B applies control signals to the adjustable pulse generators 40 in the selected ones of the n A/D converter 2.$_i$ (i=1, 2, ..., n) based on the information in the memory allocation parameter register 8 so that the corresponding adjustable pulse generators 40 generate sampling pulses during a predetermined time interval according to the designated sampling rates.

In step 816, the selected ones of the n DEMUX 19 (19.$_i$, 19.$_2$, ..., 19.$_n$) pass the elected sample date to the memory R/W circuit 18 as shown in FIG. 2A. Or the selected ones of the n DEMUX 19 (19.$_1$, 19.$_2$, ..., 19.$_n$) pass all sample date from the corresponding n A/D converter 2.$_i$ (i=1, 2, ..., n) to the memory R/W circuit 18 as shown in FIG. 2B.

In step 818, the memory R/W circuit 18 writes the elected sample data as shown in FIG. 2A (or sample data as shown in FIG. 2B) for the selected channels into the designated memory areas according to the information in the memory allocation parameter register 8. However, the memory R/W circuit 18 will not write any sample data for the non-selected (or inactive) channels.

In step 820, the data acquisition controller 6 sends the parameters in the memory allocation register 8 to the display controller 11 in the display processor 5, which in turn stores the parameters into the display parameter register 12. Under the control of the data acquisition controller 6, the memory R/W circuit 18 sends the sample data in the acquisition memory 10 to the waveform processor 24, which in turn processes the sample data and store the processed sample data into the display buffer 13, according to the information in the display parameter register 12, including the selected channel numbers, memory lengths (or record lengths) and/or sampling rates.

After sending out all sample data in the acquisition memory 10, the sampling date processor 3 is ready to acquire next group of sample data from the selected channels and store subsequent sample data into the acquisition memory 10.

In step 822, the display controller 11 displays the sample data on the display device 14 in a wave format.

If only one of the n channels is selected, the data acquisition controller 6 allocates all memory resource in the acquisition memory 10 for the selected one channel.

Figure 9:
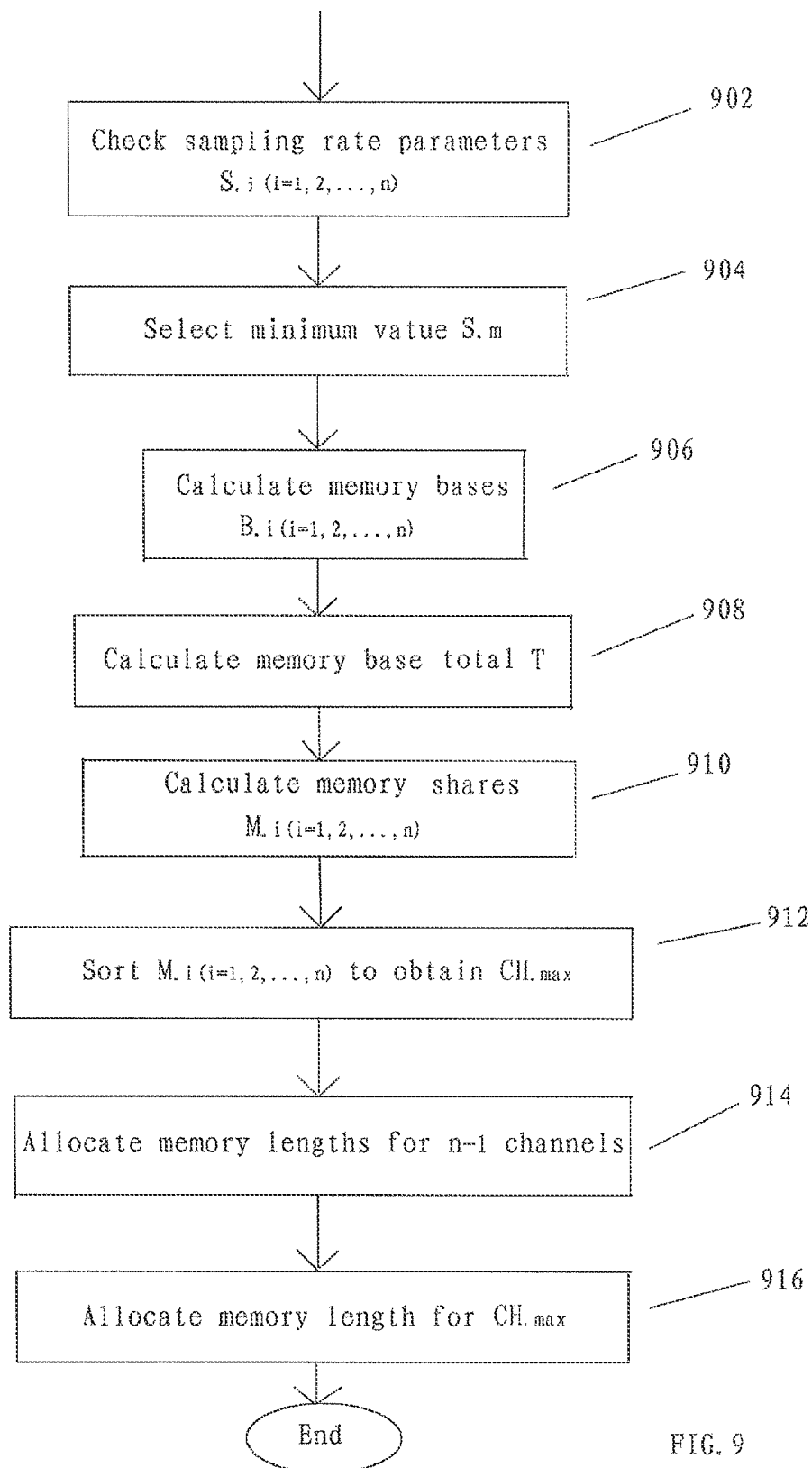
FIG. 9 shows an exemplary flowchart of the algorithm for allocating memory areas (i.e., memory lengths or record lengths) based on the frequencies (or speeds) of the received signals for selected ones of the n channels (CH.1, CH.2, . . . , CH.n).

FIG. 9 shows an exemplary flowchart of the algorithm for allocating memory areas within the acquisition memory 10 based on the frequencies (or speeds) of the received signals for selected ones of the n channels (CH.$_1$, CH.$_2$, ..., CH.$_n$), or the designated sampling rate, according to one embodiment in the present disclosure. To facilitate description, it is assumed that all n channels (CH.$_1$, CH.$_2$, ..., CH.$_n$) are selected and the parameters for the sampling rates have been stored in the memory allocation parameter register 8. The principle here should be applicable to the situation in which only a portion of the n channels (CH.$_1$, CH.$_2$, ..., CH.$_n$) are selected.

In step 902, the data acquisition controller 6 checks the parameters about the sampling rates (S.$_1$, S.$_2$, ..., S.$_n$) in the memory allocation parameter register 8 for the n channels.

In step 904, the data acquisition controller 6 selects the minimum value S.$_m$ among the n sampling rates S.$_1$, S.$_2$, ..., S.$_n$, indicated as S.$_{min}$=Minimum (S.$_1$, S.$_2$, ..., S.$_n$).

In step 906, the data acquisition controller 6 calculates n memory bases B.$_i$, i=1, 2, ..., n, for the n channels (CH.$_1$, CH.$_2$, ..., CH.$_n$), as follows:

$$B._i = \text{Integer}[S._i/S._{min}], i=1, 2, \ldots, n$$

In step 908, the data acquisition controller 6 calculates the memory base total T for the n channels (CH.$_1$, CH.$_2$, ..., CH.$_n$) by adding all memory bases B.$_i$ (i=1, 2, ..., n,) together, as follows:

$$T = B._1 + B._2 + \ldots + B._n$$

In step 910, the data acquisition controller 6 calculates n memory shares M.$_i$, i=1, 2, ..., n, for each of the n channels (CH.1, CH.2, ..., CH.n), as follows:

$$M._i = B._i/T, i=1, 2, \ldots, n$$

In step 912, the data acquisition controller 6 sorts the memory shares M.$_i$ i=1, 2, ..., n, for the n channels (CH.$_1$, CH.$_2$, ..., CH.$_n$) in an ascending order according to their memory share to obtain the largest memory share M.$_{max}$ and its corresponding channel CH.$_{max}$.

In step 914, the data acquisition controller 6 partitions the acquisition memory 10 into n memory lengths (or record lengths) L.$_i$, i=1, 2, ..., n, for the n channels (CH.$_1$, CH.$_2$, ..., CH.$_n$), and allocates memory resource for the n-1 channels, except not for channel CH.$_{max}$, as follows:

$$L._i = \text{Memory size} \times M._i, i=1, 2, \ldots, n$$

In step 916, after allocating the memory lengths (or record lengths) for the n−1 channels, the data acquisition controller 6 allocates the remaining memory length (or the remaining record length) to the CH.$_{Max}$. It should be noted that allocating the memory length (or record length) last for the CH.$_{Max}$ can avoid over-allocating or under-allocating of the memory resource in the acquisition memory 10.

It should be appreciated that the acquisition architecture in the present disclosure can dynamically and proportionally allocate the acquisition memory resource based on selections of input channels, the designations of the memory areas (or memory lengths) and/or sampling rates. Especially, the acquisition architecture can efficiently and flexibly allocate the acquisition memory resource for the selected channels, even if each of the selected channels acquire/measure different ones of the signals under test. In this manner, the acquisition architecture can flexibly allocate the acquisition memory resource for any selection permutation of the n channels that acquire and/or measure different input signals. By contrast, it is not flexible to use interleaving technology to share an acquisition memory among multiple channels. For example, when a user wishes to measure three (3) input signals, it is not possible to share the memory assigned to the fourth channel evenly/proportionally among the three (3) selected/active channels. In addition, the acquisition architecture can efficiently allocate acquisition memory resource based on the frequencies (or speeds) of the input signals under test.

The word "or", in the following claims, is used in the inclusive sense, one or the other or both, and is intended to cover cases in which multiple alternatives are present, but does not require more than one of the recited alternatives to be present. The word "speed", in the following claims, is used in its normal meaning in the electronics field as in "high speed signals". That is, the "speed" of a signal is defined by its frequency, and by its bandwidth.

It will be apparent to those skilled in the art that various modifications and variations can be made to the embodiments described herein without departing from the spirit and scope of the claimed subject matter. Thus, it is intended that the specification covers the modifications and variations of the various embodiments described herein, provided such modification and variations come within the scope of the appended claims and their equivalents.

What is claimed is:

1. An acquisition system for an oscilloscope, comprising:
a plurality of channels that acquire and/or measure different input signals;
a plurality of A/D converters with each of the plurality of A/D converters receiving a signal under test from one of the plurality of channels and digitizing the received signal into digital samples;
an acquisition memory, coupled to the plurality of A/D converters, for storing the digitized samples from the plurality of A/D converters; and
a memory allocation processor for allocating a first memory length within the acquisition memory to a first one of the plurality of channels, and a second memory length within the acquisition memory to a second one of the plurality of channels, wherein the first and second memory lengths are different.

2. The acquisition system of claim 1, wherein:
the memory allocation processor allocates a memory length or memory lengths in response to any selection permutation of the n channels that acquire and/or measure different input signals.

3. The acquisition system of claim 2, wherein:
the memory allocation processor allocates a memory length or memory lengths within the acquisition memory based on the user setting from the oscilloscope.

4. The acquisition system of claim 3, wherein:
the memory allocation processor allocates a memory length or memory lengths for a selected channel or selected channels in the acquisition memory, but does not allocate any memory area for a non-selected channel.

5. The acquisition system of claim 4, wherein:
the memory allocation processor allocates a memory length for the sample data based on a designated sampling rate and/or a designated memory length within a predetermined time interval.

6. The acquisition system of claim 5, wherein:
the memory allocation processor allocates a longer memory length for a selected channel that receives a signal having a higher speed, or has a higher designated sampling rate, or has a longer designated memory length.

7. The acquisition system of claim 2, wherein:
a particular one of the plurality of A/D converters digitizes the received signal using the sampling rate designated in a user setting or detected by a sampling rate controller;
the memory allocation processor including a storage location for storing the memory allocation parameters.

8. The acquisition system of claim 7, wherein:
the user setting of the oscilloscope is received from a front panel or communication interface, and includes memory allocation parameters that comprise selected channel numbers, memory lengths, and/or sampling rates.

9. The acquisition system of claim 2, further comprising:
a sampling rate controller for controlling the sampling rates for the plurality of channels.

10. The acquisition system of claim 9, further comprising:
a display processor for processing and displaying the digital samples stored in the acquisition memory for the selected channels.

11. The acquisition system of claim 10, wherein:
the display processor comprises a storage location for storing the parameters to display the digitized samples.

12. An acquisition system for an oscilloscope having a plurality of channels, comprising:
a plurality of A/D converters with each of the plurality of A/D converters receiving a signal under test from one of the plurality of channels and digitizing the received signal into digital samples;
an acquisition memory for storing the digitized samples from the plurality of A/D converters;
a user-operable data entry device for entering settings desired by a user;
a sampling rate controller detecting the speeds of the signals received from the plurality of channels and configured to allocate different sampling rates for each of the plurality of A/D converters based on the detected speeds of the signals from the plurality of channels;
a memory allocation processor configured to allocate a different memory length within the acquisition memory for each of the plurality of channels.

13. The acquisition system of claim 12, wherein:
the sampling rate controller further controls the sampling rates for the plurality of A/D converters based on the user setting from the oscilloscope or on an operation from a communication interface.

14. The acquisition system of claim 13, wherein the memory allocation processor allocates a memory length within the acquisition memory for the plurality of channels based on the speeds of the signals received from the plurality of channels by allocating a larger memory area for a channel that receives a signal with a higher speed, or allocates memory length based on the user setting from the oscilloscope;
the memory allocation processor including a location for storing the memory allocation parameters.

15. The acquisition system of claim 14, wherein:
a particular one of the plurality of A/D converters digitizes the received signal using the sampling rate designated in the user setting of the oscilloscope.

16. The acquisition system of claim 15, wherein:
the user setting of the oscilloscope is received from a front panel or communication interface; and
the user setting of the oscilloscope includes selected channel numbers, memory lengths and/or sampling rates.

17. The acquisition system of claim 16, further comprising:
a waveform processor for processing the digital samples stored in the acquisition memory based on the memory allocation parameters.

18. The acquisition system of claim 17, further comprising:
a display processor for processing and displaying the digital samples stored in the acquisition memory based on the memory allocation parameters, the display processor including a storage location for storing memory allocation parameters.

19. A method for use with an acquisition system for an oscilloscope, which comprises a plurality of channels that acquire and/or measure different input signals; a plurality of A/D converters with each of the plurality of A/D converters receiving a signal under test from one of the plurality of channels and digitizing the received signal into digital samples; and an acquisition memory for storing the digitized samples; the method comprising the steps of:

selecting two or more channels from the plurality of channels that acquire and/or measure different input signals; and allocating memory resource in the acquisition memory by partitioning the acquisition memory into two or more different memory lengths in response to the selection of the plurality of channels, wherein the step of allocating memory allocates a longer memory length for a selected channel that has a higher designated sampling rate or has a longer designated memory length.

20. The method of claim 19, wherein:

the step of channel selection is performed in response to a user setting from the oscilloscope or an communication interface.

21. The method of claim 20, further comprising the step of:

designating a sampling rate or sampling rates for the selected channel or channels in response to a user setting from the oscilloscope or an communication interface.

22. The method of claim 21, further comprising the step of:

designating a memory length of the selected channel or channels, the step of memory length designation being performed in response to a user setting from the oscilloscope or a communication interface.

23. A method for use with an acquisition system for an oscilloscope, which comprises a plurality of channels that acquire and/or measure different input signals; a plurality of A/D converters with each of the plurality of A/D converters receiving a signal under test from one of the plurality of channels and digitizing the received signal into digital samples; and an acquisition memoly for storing the digitized samples; the method comprising the steps of:

detecting speeds for the signals that are acquired from a plurality of channels; designating sampling rates for the plurality of channels in response to the detected speeds;

converting the input signals into digitized sample data using the detected sampling rate or sampling rates;

allocating memory resources in the acquisition memory by partitioning the acquisition memory into a plurality of memory lengths in response to the designated sampling rates, the step of allocating memory allocates a longer memory length for a selected channel that has a higher detected sampling rate wherein the allocated length can be different for each channel.

* * * * *